United States Patent [19]

Miyamoto

[11] Patent Number: 5,645,683
[45] Date of Patent: Jul. 8, 1997

[54] ETCHING METHOD FOR ETCHING A SEMICONDUCTOR SUBSTRATE HAVING A SILICIDE LAYER AND A POLYSILICON LAYER

[75] Inventor: Hidenobu Miyamoto, Tokyo, Japan

[73] Assignee: NEC Corporation, Tokyo, Japan

[21] Appl. No.: 385,124

[22] Filed: Feb. 7, 1995

[30] Foreign Application Priority Data

Feb. 7, 1994 [JP] Japan ................................. 6-013315

[51] Int. Cl.⁶ ................................................. H01L 21/00
[52] U.S. Cl. ........................... 156/643.1; 156/653.1; 156/656.1; 156/657.1
[58] Field of Search ........................... 156/643.1, 656.1, 156/657.1, 653.1

[56] References Cited

U.S. PATENT DOCUMENTS

| | | | |
|---|---|---|---|
| 5,094,712 | 3/1992 | Becker et al. | 156/643 |
| 5,203,958 | 4/1993 | Arai et al. | 156/643.1 |
| 5,259,923 | 11/1993 | Hori et al. | 156/643.1 |

FOREIGN PATENT DOCUMENTS

| | | |
|---|---|---|
| 150336 | 7/1986 | Japan. |
| 3-127826 | 5/1991 | Japan. |
| 142737 | 5/1992 | Japan. |

*Primary Examiner*—Thi Dang
*Attorney, Agent, or Firm*—Sughrue, Mion, Zinn, Macpeak & Seas

[57] ABSTRACT

During etching of semiconductor substrate having a polysilicon layer and a silicide layer on the polysilicon layer by plasma etching to produce a processed semiconductor substrate having a patterned silicide layer and a patterned polysilicon layer, the semiconductor substrate is located on a supporting electrode. The temperature of the electrode is controlled to a predetermined temperature. The predetermined temperature may be, for example, 0° C. The silicide layer is etched into the patterned silicide layer by plasma etching. The semiconductor substrate is placed in closer contact with the supporting electrode. A coolant gas is then supplied to the supporting electrode in order to cool the supporting electrode. The polysilicon layer is etched into the patterned polysilicon layer by plasma etching in order to produce the processed semiconductor substrate.

8 Claims, 6 Drawing Sheets

ETCHING METHOD FOR ETCHING A SEMICONDUCTOR SUBSTRATE HAVING A SILICIDE LAYER AND A POLYSILICON LAYER

BACKGROUND OF THE INVENTION:

This invention relates to an etching method for etching a semiconductor substrate having a polysilicon layer and a silicide layer on the polysilicon layer.

In general, a semiconductor device is known which comprises a semiconductor substrate having a polysilicon layer and a silicide layer on the polysilicon layer. The silicide layer and the polysilicon layer will collectively be called a polycide layer. The polycide layer may be etched into a gate electrode by etching. It is necessary to etch the polycide layer into the gate electrode at high accuracy when the semiconductor device is an LSI.

In order to etch the polycide layer into the gate electrode at high accuracy, a conventional etching method is disclosed in Japanese Unexamined Publication Tokkai Hei 3-127826 (127826/1991) which was published on May 30, 1991. Plasma etching is used in the conventional etching method. By using a resist film as a first etching mask, the silicide layer is etched into a patterned silicide layer by an etching plasma. The etching plasma may be composed of chloride and hydrogen bromide. After removing the first etching mask, the polysilicon layer is etched into a patterned polysilicon layer by an etching gas by using an oxide film as a second etching mask. Hydrogen bromide may be used as the etching gas.

However, the first etching mask is different in material from the second etching mask in the conventional etching method. Namely, it is necessary to use at least two etching masks on etching the polycide layer in the conventional etching method. In addition, it is necessary to remove the first etching mask after etching the silicide layer into the patterned silicide layer.

SUMMARY OF THE INVENTION

It is an object of this invention to provide an etching method capable of readily etching a semiconductor substrate having a polysilicon layer and a silicide layer on the polysilicon layer at high accuracy.

Other objects of this invention will become clear as the description proceeds.

According to this invention, there is provided an etching method for etching a semiconductor substrate having a polysilicon layer and a silicide layer on the polysilicon layer by plasma etching to produce a processed semiconductor substrate having a patterned polysilicon layer and a patterned silicide layer on the patterned polysilicon layer. The etching method comprises the steps of locating the semiconductor substrate on a supporting member of which temperature is controlled to a predetermined temperature, etching the silicide layer into the patterned silicide layer by the plasma etching, cooling the supporting member, and etching the polysilicon layer into the patterned polysilicon layer by the plasma etching to produce the processed semiconductor substrate.

DESCRIPTION OF THE PREFERRED EMBODIMENT

Figure 1:
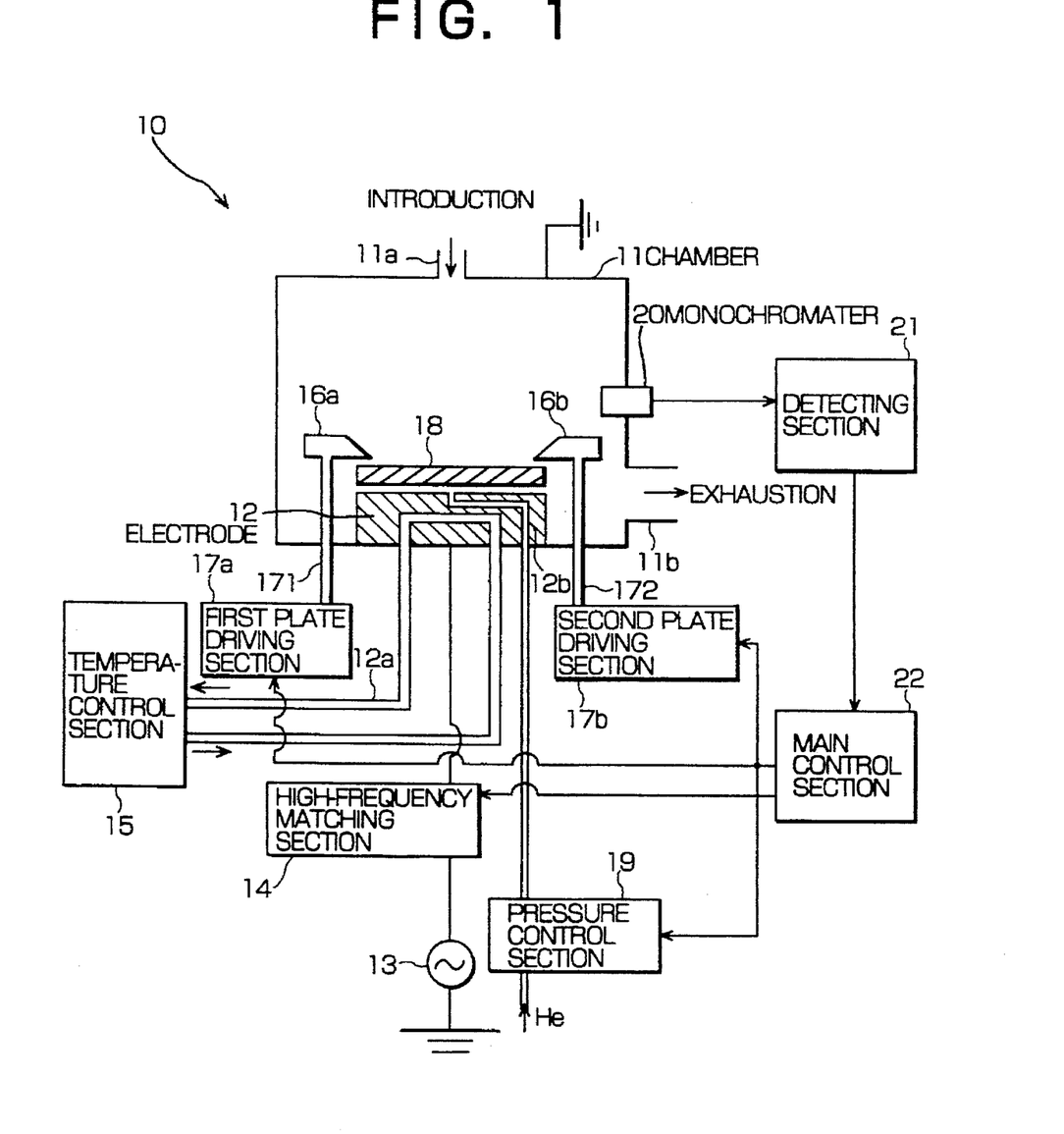
FIG. 1 is a block diagram illustrating an example of an etching apparatus for use in an etching method according to a preferred embodiment of this invention.

Referring to FIG. 1, description will be made with respect to an example of an etching apparatus for use in an etching method according to a preferred embodiment of this invention. The etching method is for etching a semiconductor substrate having a polysilicon layer and a silicide layer on the polysilicon layer by plasma etching to produce a processed semiconductor substrate having a patterned silicide layer and patterned polysilicon layer. The illustrated etching apparatus is for use in carrying out the etching method.

The etching apparatus comprises a sealed metal chamber 11. A supporting electrode 12 is located on an inner wall of the sealed chamber 11. The supporting electrode 12 may be called a lower electrode. The lower electrode 12 is supplied with a high-frequency power from a high-frequency power source 13 through a high-frequency matching section 14 as will later be described.

The lower electrode 12 has a cooling path 12a through which a cooling water passes. The cooling path 12a is connected to a temperature control section 15. Namely, the cooling path 12a is formed in the lower electrode 12 and is supplied with the cooling water from the temperature control section 15. The temperature control section 15 makes the temperature of the cooling water be a predetermined temperature. As a result, the temperature of the lower electrode 12 is controlled into the predetermined temperature by the temperature control section 15.

First and second clamping plates 16a and 16b are positioned above the lower electrode 12 in the sealed chamber 11. The first clamping plate 16a and the second clamping plate 16b stand opposite to each other separated by a predetermined distance. The first and the second clamping plates 16a and 16b are connected to first and second plate driving sections 17a and 17b through first and second rods 171 and 172, respectively. The first and the second clamping plates 16a and 16b are synchronously driven upwardly and downwardly of FIG. 1 by the first and the second plate driving sections 17a and 17b, respectively.

Although illustration is not made in FIG. 1, a ring-shaped plate may be used instead of the first and the second clamping plates 16a and 16b. In this case, the ring-shaped plate is supported by a cylindrical member which is connected to a driving section. The driving section may be one of the first and the second plate driving sections 17a and 17b.

A semiconductor wafer 18 is located on the lower electrode 12 during etching the semiconductor wafer 18. The semiconductor wafer 18 has a polysilicon layer (not shown) and the silicide layer (not shown) on the polysilicon layer. On locating the semiconductor wafer 18 on the lower electrode 12, the semiconductor wafer 18 may be clamping by the first and the second clamping plates 16a and 16b to be in close contact with the lower electrode 12. More particularly, the semiconductor wafer 18 may be pushed downwardly of FIG. 1 by the first and the second clamping plates 16a and 16b to be in close contact with the lower electrode 12.

Reviewing FIG. 1, a gas path 12b is formed in the lower electrode 12. The gas path 12b reaches to an upper surface of the lower electrode 12 as shown in FIG. 1. The gas path 12b is given a coolant gas by a pressure control section 19 which is connected to a coolant gas source (not shown). The coolant gas may be, for example, helium gas.

A monochromator 20 is attached on the side wall of the sealed chamber 11 so as to reach in the sealed chamber 11. The monochromator 20 is for monitoring an emission spectrum emitted from the semiconductor wafer 18 on etching to produce a monitored emission spectrum. The monochromator 20 is connected to a detecting section 21 which detects whether or not the etching of the semiconductor wafer 18 ends in accordance with the monitored emission spectrum. More specifically, the detecting section 21 produces a first end signal when the detecting section 21 knows that the etching of the silicide layer ends in accordance with the monitored emission spectrum. Similarly, the detecting section 21 produces a second end signal when the detecting section 21 knows that the etching of the polysilicon layer ends in accordance with the monitored emission spectrum.

The detecting section 21 is connected to a main control section 22 and supplies the first and the second end signals to the main control section 22. Supplied with any one of the first and the second end signals, the main control section 22 controls the high-frequency matching section 14, first and second plate driving sections 17a and 17b, and pressure control section 19 as will later be described.

Referring to FIG. 2 in addition to FIG. 1, it will be assumed that the silicide layer is a WSi layer and that a photoresist film is used as an etching mask. On etching the semiconductor wafer 18, the semiconductor wafer 18 is located on the lower electrode 12. At that time, a slight clearance inevitably exists between the semiconductor wafer 18 and the lower electrode 12. The temperature of the lower electrode 12 is controlled to 0° C. by the temperature control section 15.

Figure 2A:
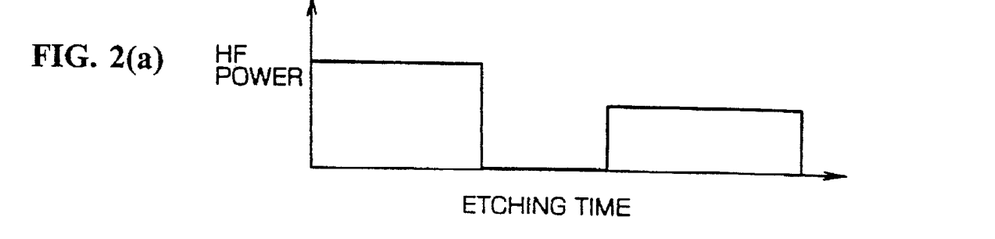
FIGS. 2a–2d depicts a signal view for describing an etching operation of the etching apparatus illustrated in FIG. 1.
Figure 2B:
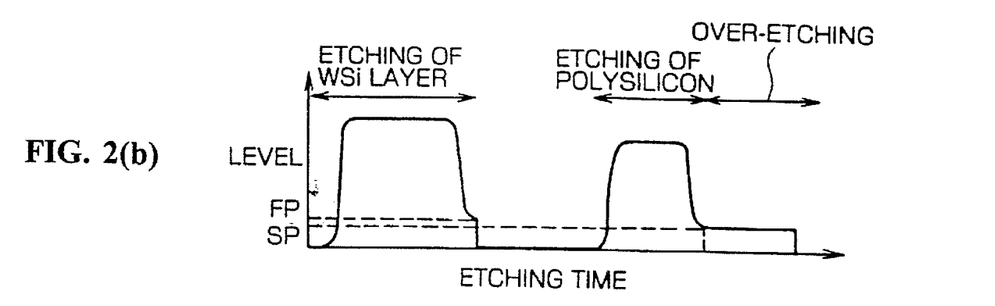
Figure 2C:
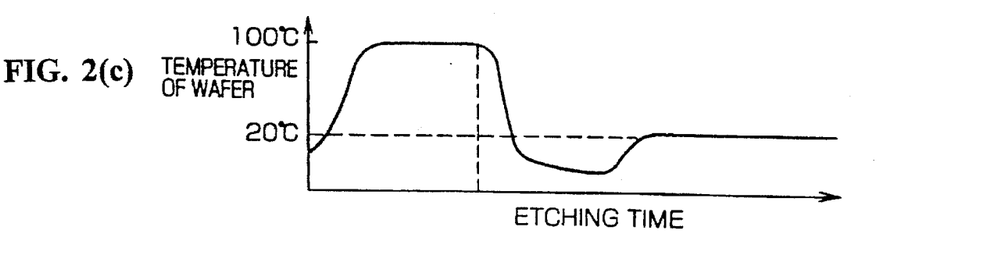

Under the circumstances, an etching gas is introduced into the sealed chamber 11 through an inlet port 11a. The etching gas is composed of chlorine and oxygen. For example, the chlorine is introduced into the sealed chamber 11 with a flow rate of 30 sccm. The oxygen is introduced into the sealed chamber 11 with a flow rate of 2 sccm. The pressure of the sealed chamber 11 is kept at a pressure of 10 mTorr. In order to produce plasma as an etching plasma in the sealed chamber 11, the high-frequency matching section 14 supplies the lower electrode 12 with the high-frequency (HF) power of 300 watts under control of the main control section 22 as shown in a first row labelled (a) in FIG. 2. The WSi layer of the semiconductor wafer 18 is etched into a patterned WSi layer by the etching plasma.

Figure 3A:
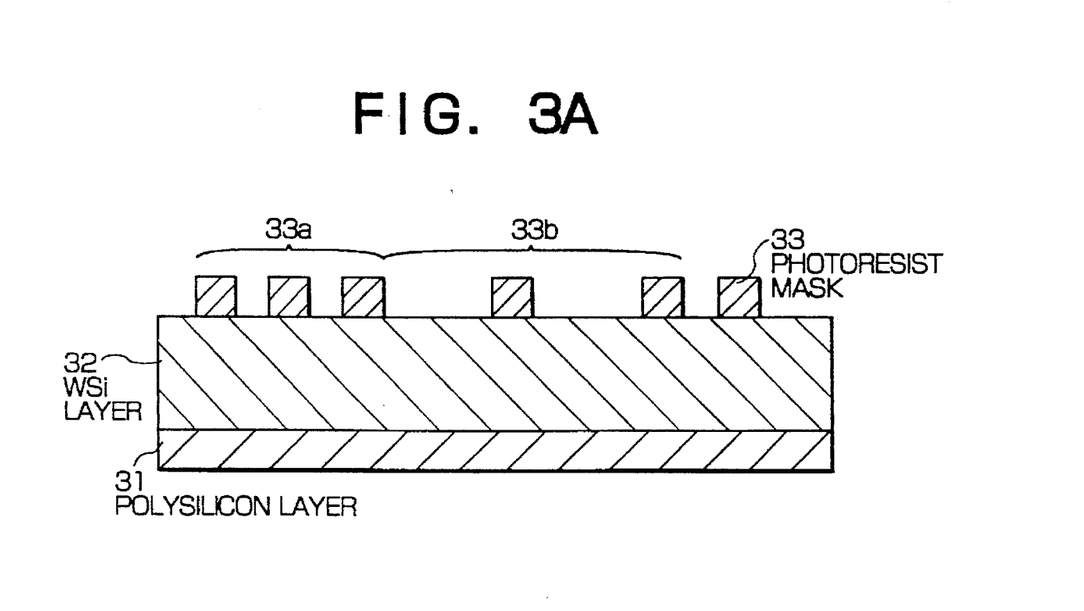
FIG. 3A is a sectional view illustrating a WSi layer and a polysilicon layer before etching the WSi layer.

Referring to FIG. 3, the polysilicon layer and the WSi layer are designated by reference numerals 31 and 32, respectively, in FIG. 3A. The photoresist mask is designated by a reference numeral 33 in FIG. 3A. In FIG. 3A, it will be assumed that the photoresist mask 33 has a first part 33a and a second part 33b. The first part 33a has a dense resist pattern. The second part 33b has a coarse resist pattern.

Figure 3B:
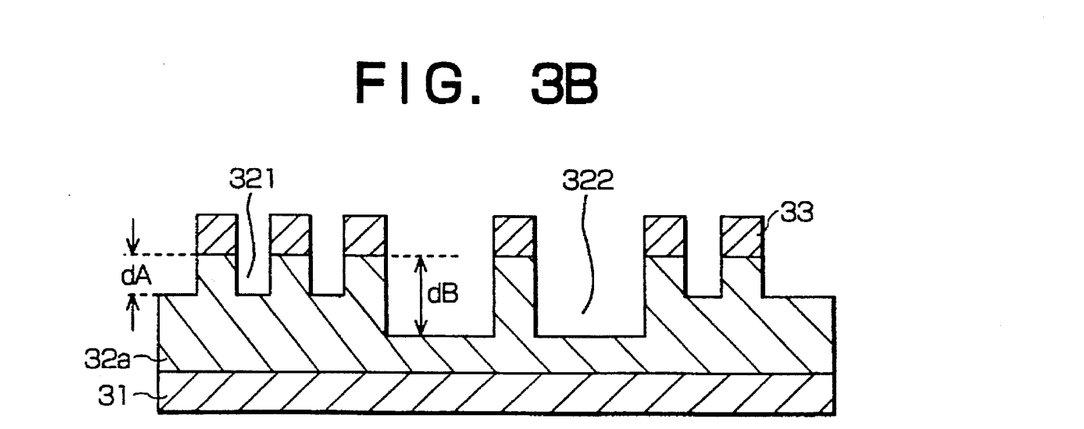
FIG. 3B is a sectional view illustrating a patterned WSi layer and the polysilicon layer after etching the WSi layer.

When the WSi layer 32 is etched by using the photoresist mask 33 as shown in FIG. 3A, the WSi layer 32 is etched into a patterned WSi layer 32a having a first etched pattern 321 and a second etched pattern 322 as shown in FIG. 3B. The first etched pattern 321 corresponds to the first part 33a. The second etched pattern 322 corresponds to the second part 33b. The first etched pattern 321 may have a first etched depth given by dA. The second etched pattern 322 may have a second etched depth given by dB.

Figure 4:
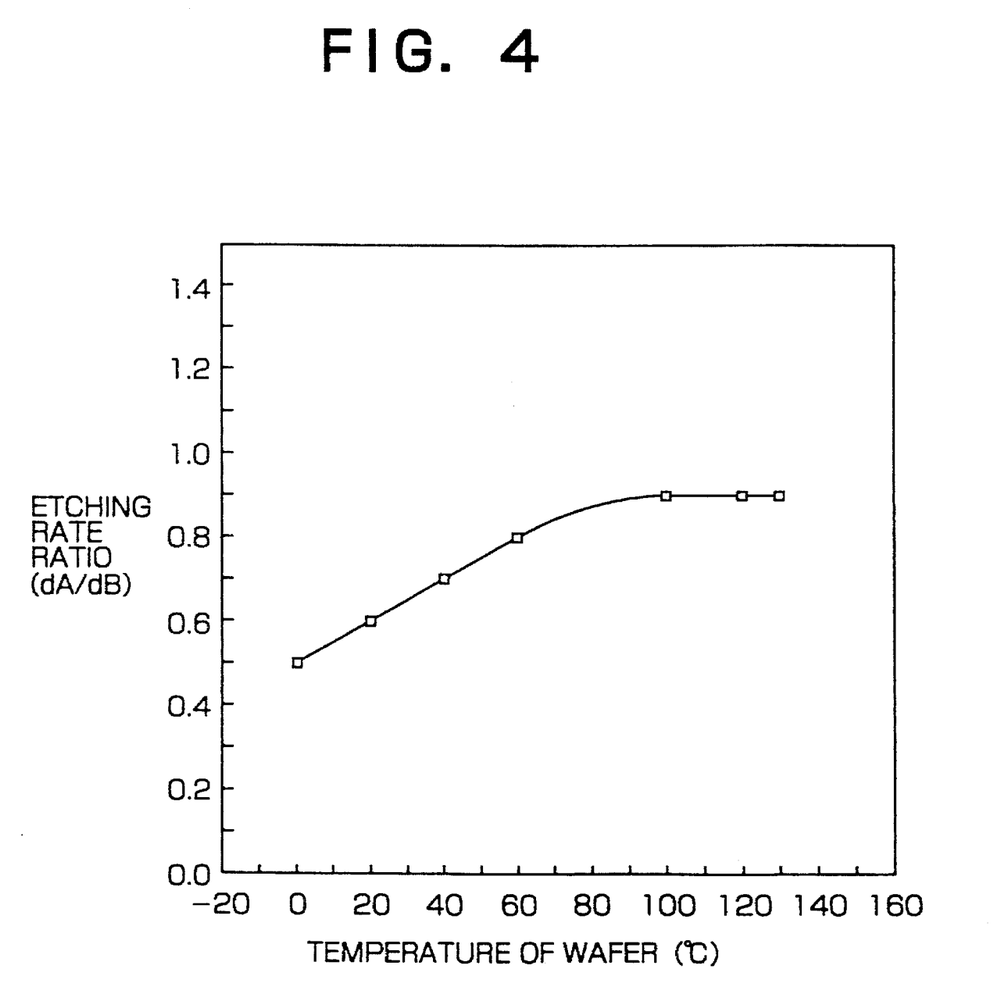
FIG. 4 is a diagram for describing a relationship between a temperature of a semiconductor wafer and an etching rate ratio on etching a WSi layer by a gas including chlorine.

Referring to FIG. 4, it is known in the art that an etching rate ratio is defined by dA/dB. From FIG. 4, it is to be noted that the etching rate ratio decreases as the temperature of the semiconductor wafer 18 becomes lower and lower. As described above, the etching rate ratio is defined by dA/dB. Therefore, the first etched depth dA is greatly different from the second etched depth dB when the etching rate ratio decreases. Namely, the first etched depth dA is greatly different from the second etched depth dB when the temperature of the semiconductor wafer 18 is low. Accordingly, it is desirable to make the temperature of the semiconductor wafer 18 be high in order that the first etched depth dA is approximately equal to the second etched depth dB.

Again referring to FIGS. 1 and 2, the temperature of the semiconductor wafer 18 is heated to about 100° C. by the etching plasma when the WSi layer is etched while controlling the temperature of the lower electrode 12 to 0° C. as described above. More particularly, the semiconductor wafer 18 is not effectively chilled by the lower electrode 12 because of the slight clearance between the lower electrode 12 and the semiconductor wafer 18. When the temperature of the lower electrode 12 is 0° C., the temperature of the semiconductor wafer 18 is about 100° C.

As described above, the monochromator 20 monitors the emission spectrum emitted from the semiconductor wafer 18 on etching. The monochromator 20 produces a monitored signal representative of the monitored emission spectrum. More specifically, the monochromator 20 produces a first monitored signal as the monitored signal on etching the WSi layer to supply the first monitored signal to the detecting section 21.

As shown at a second row labelled (b) in FIG. 2, the first monitored signal has a first monitored level. The first monitored level rises to a first balance level after the start of etching of the WSi layer. After some etching interval, the first monitored level drops.

When the first monitored level drops and reaches to a first predetermined level labelled FP at the second row (b) in FIG. 2, the detecting section 21 detects that the etching of the WSi layer ends. Namely, the detecting section 21 detects whether or not the etching of the WSi layer ends in accordance with the first monitored signal. When the detecting section 21 detects that the etching of the WSi layer ends, the detecting section 21 supplies the first end signal to the main control section 22. As shown at a third row labelled (c) in FIG. 2, the temperature of the semiconductor wafer 18 rises to about 100° C. as the etching of the WSi layer proceeds.

Responsive to the first end signal, the main control section 22 controls the high-frequency matching section 14 to make the high-frequency matching section 14 stop supplying the high-frequency power to the lower electrode 12 as shown at the first row (a) in FIG. 2. After that, the etching gas is exhausted from the sealed chamber 11 through an outlet port 11b.

Figure 2D:
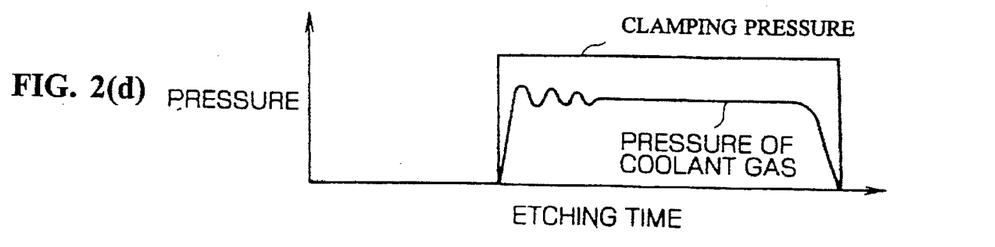

The main control section 22 controls the first and the second plate driving sections 17a and 17b so that the first and the second plate driving sections 17a and 17b drive the first and the second clamping plates 16a and 16b downwardly of FIG. 1, respectively. As a result, the semiconductor wafer 18 is pushed downwardly of FIG. 1 by the first and the second clamping plates 16a and 16b to be clamped at a predetermined clamping pressure as shown at a fourth row labelled (d) in FIG. 2. The semiconductor wafer 18 is in close contact with the lower electrode 12. Namely, the slight clearance does not exist between the semiconductor wafer 18 and the lower electrode 12.

As shown in the fourth row (d) in FIG. 2, the main control section 22 controls the pressure control section 19 to make the pressure control section 19 supply the coolant gas to the sealed chamber 11 through the gas path 12b which is formed in the lower electrode 12.

When the semiconductor wafer 18 is in close contact with the lower electrode 12 and the coolant gas is supplied to the sealed chamber 11 as described above, the semiconductor wafer 18 is effectively chilled by the lower electrode 12 so that the temperature of the semiconductor wafer 18 drops as shown at the third row (c) in FIG. 2.

After the pressure of the coolant gas becomes stable as shown at the fourth row (d) in FIG. 2, the etching gas is introduced into the sealed chamber 11 through the inlet port 11a. In this case, the chlorine is introduced into the sealed chamber 11 with a flow rate of 10 sccm. The oxygen is introduced into the sealed chamber 11 with a flow rate of 2 sccm. The pressure of the sealed chamber 11 is kept at a pressure of 5 mTorr.

After that, the main control section 22 controls the high-frequency matching section 14 so that the high-frequency matching section 14 supplies the lower electrode 12 with the high-frequency power of 150 watts as shown at the first row (a) in FIG. 2 in order to produce the etching plasma in the sealed chamber 11. The polysilicon layer of the semiconductor wafer 18 is etched into a patterned polysilicon layer by the etching plasma.

According to a test, the temperature of the semiconductor wafer 18 is about 20° C. during etching of the polysilicon layer because as the semiconductor wafer 18 is in close contact with the lower electrode 12 and the coolant gas is supplied to the sealed chamber 11 through the gas path 12b which is formed in the lower electrode 12.

The monochromator 20 monitors the emission spectrum emitted from the semiconductor wafer 18 on etching. More particularly, the monochromator 20 produces a second monitored signal as the monitored signal on etching the polysilicon layer to supply the second monitored signal to the detecting section 21.

As shown at the second row (b) in FIG. 2, the second monitored signal has a second monitored level. The second monitored level rises to a second balance level after the start of etching of the polysilicon layer. After some etching interval, the second monitored level drops.

When the second monitored level drops and reaches a second predetermined level labelled SP at the second row (b) in FIG. 2, the detecting section 21 detects that the etching of the polysilicon layer ends. Namely, the detecting section 21 detects whether or not the etching of the polysilicon layer ends in accordance with the second monitored signal. When the detecting section 21 detects that the etching of the polysilicon layer ends, the detecting section 21 supplies the second end signal to the main control section 22.

Responsive to the second end signal, the main control section 22 controls the high-frequency matching section 14 so that the high-frequency matching section 14 stops supplying the high-frequency power to the lower electrode 12 as shown at the first row (a) in FIG. 2 after a predetermined time duration lapses. After that, the etching gas is exhausted from the sealed chamber 11 through the outlet port 11b. Namely, the polysilicon layer is etched until the predetermined time duration lapses after the second end signal is supplied to the main control section 22. This etching may be called over-etching. When the over-etching ends, the semiconductor wafer 18 becomes to a processed semiconductor wafer having the patterned WSi layer and the patterned polysilicon layer.

Furthermore, the main control section 22 controls the pressure control section 19 to make the pressure control section 19 stop supplying the coolant gas to the sealed chamber 11 as shown at the third row (c) in FIG. 2. In addition, the main control section 22 controls the first and the second plate driving sections 17a and 17b so that the first and the second plate driving sections 17a and 17b drive the first and the second clamping plates 16a and 16b upwardly of FIG. 1, respectively. As a result, the processed semiconductor wafer is removed from clamping. The slight clearance exists between the processed semiconductor wafer and the lower electrode 12.

Inasmuch as the polysilicon layer is etched into the patterned polysilicon layer under a lower temperature as described above, it is possible to obtain the processed semiconductor wafer having a good etched form.

Figure 5:
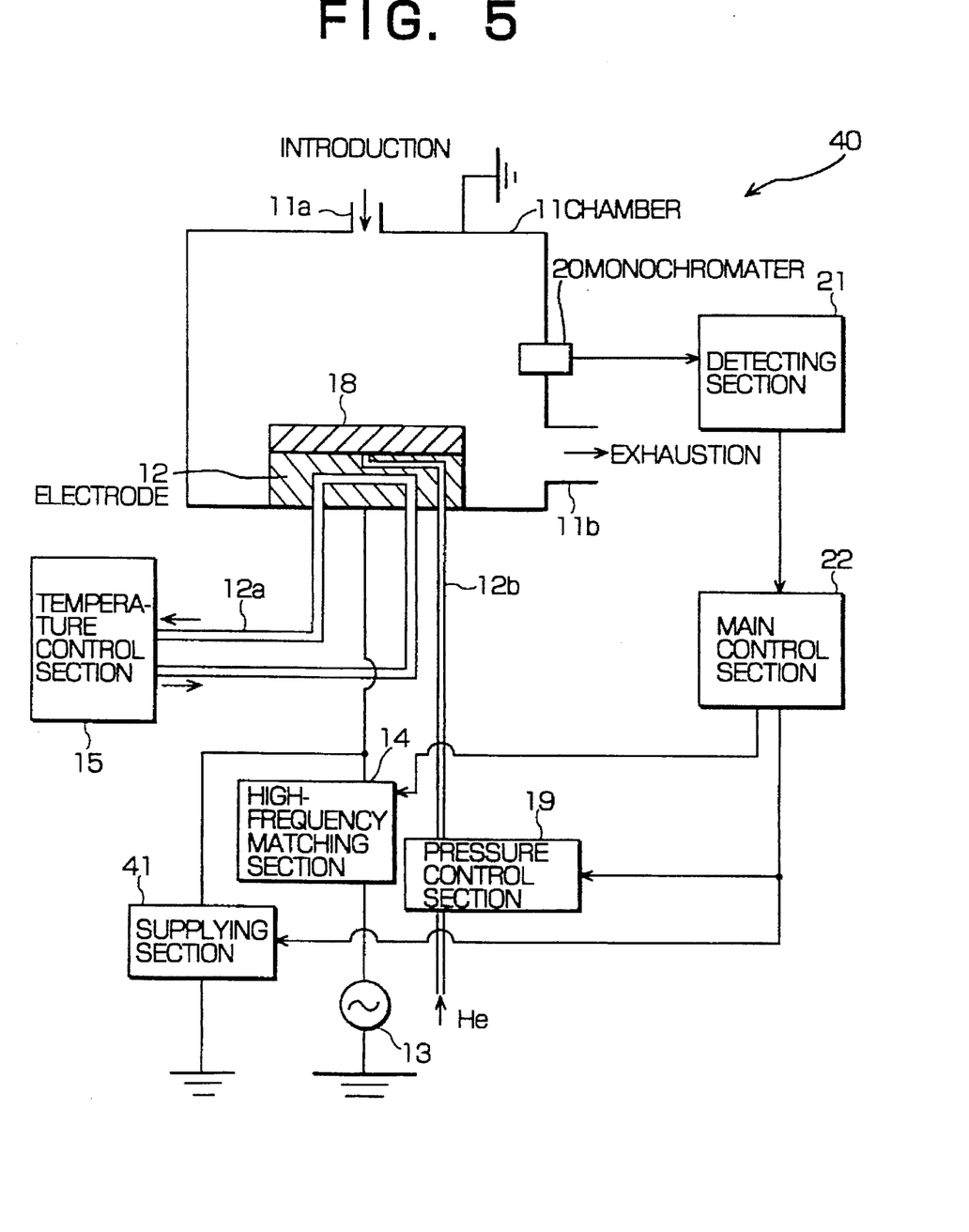
FIG. 5 is a block diagram illustrating another example of an etching apparatus for use in the etching method according to the preferred embodiment of this invention.

Referring to FIG. 5, description will proceed to another example of the etching apparatus for use in the etching method. The illustrated etching apparatus is different in structure from the etching apparatus 10 illustrated in FIG. 1 and therefore designated by a different reference numeral 40. The etching apparatus 40 comprises similar parts which are designated by like reference numerals and are operable with likewise named signals. The etching apparatus 40 comprises a static electricity supplying section 41 instead of the first and the second clamping plates 16a and 16b and the first and the second plate driving sections 17a and 17b all of which are illustrated in FIG. 1. The static electricity supplying section 41 is for supplying static electricity to the lower electrode 12 under control of the main control section 22.

Referring to FIG. 6 in addition to FIG. 5, the temperature of the lower electrode 12 is controlled to 0° C. by the temperature control section 15. The etching gas composed of chlorine and oxygen is introduced into the sealed chamber 11 through the inlet port 11a. In this case, chlorine is introduced into the sealed chamber 11 with the flow rate of 30 sccm. Oxygen is introduced into the sealed chamber 11 with the flow rate of 2 sccm. The pressure of a sealed chamber 11 is kept at the pressure of 10 mTorr. In order to produce the etching plasma in the sealed chamber 11, the high-frequency matching section 14 supplies the lower electrode 12 with the high-frequency power of 300 watts under control of the main control section 22 as shown by a solid line at a first row labelled (a) in FIG. 6. The WSi layer of the semiconductor wafer 18 is etched into the patterned WSi layer by the etching plasma.

Figure 6A:
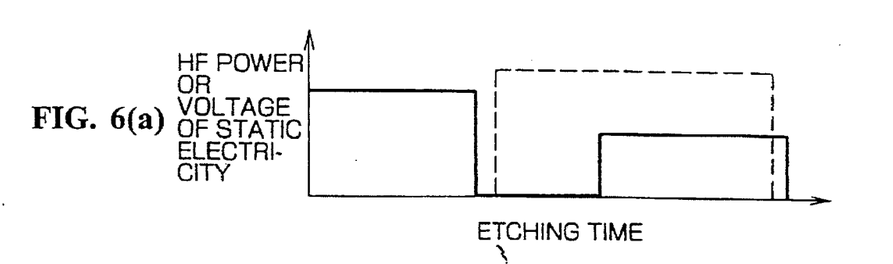
FIGS. 6a–6d depict a signal view for describing an etching operation of the etching apparatus illustrated in FIG. 5.
Figure 6B:
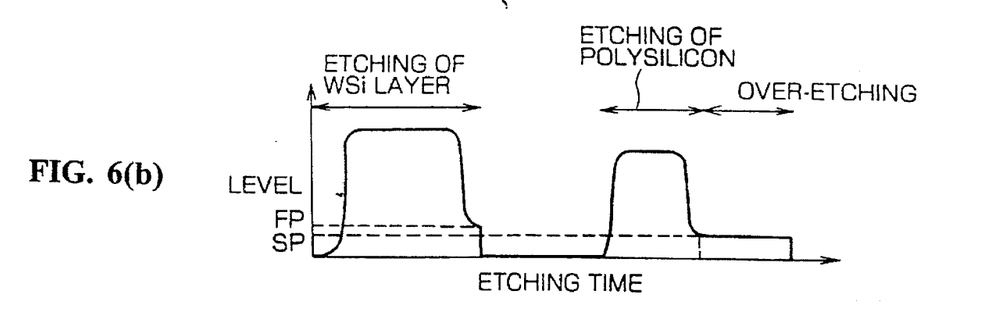
Figure 6C:
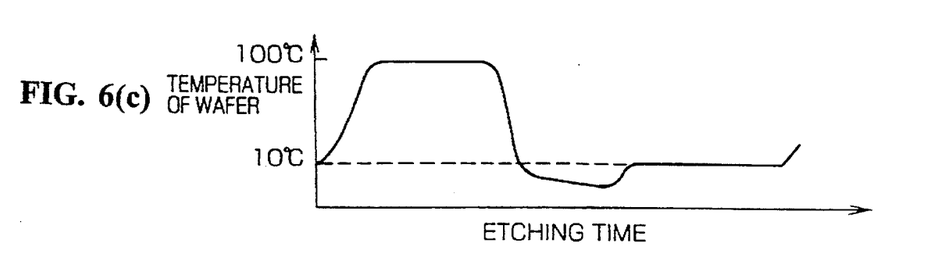
Figure 6D:
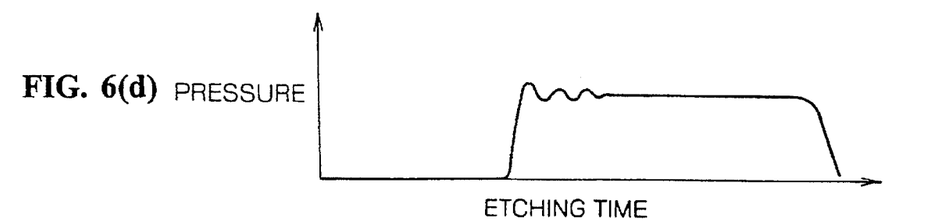

As described in conjunction with FIG. 1, the monochromator 20 monitors the emission spectrum emitted from the semiconductor wafer 18 on etching. The monochromator 20 produces the first monitored signal on etching the WSi layer to supply the first monitored signal to the detecting section 21 as shown at a second row labelled (b) in FIG. 6. As shown at a third row labelled (c) in FIG. 6, the temperature of the semiconductor wafer 18 rises to about 100° C. as the etching of the WSi layer proceeds.

When the first monitored level drops and reaches the first predetermined level (FP), the detecting section 21 detects that the etching of the WSi layer ends. When the detecting section 21 detects that the etching of the WSi layer ends, the detecting section 21 supplies the first end signal to the main control section 22.

Responsive to the first end signal, the main control section 22 controls the high-frequency matching section 14 to make the high-frequency matching section 14 stop supplying the high-frequency power to the lower electrode 12 as shown by the solid line at the first row labelled (a) in FIG. 6. After that, the etching gas is exhausted from the sealed chamber 11 through an outlet port 11b.

The main control section 22 controls the static electricity supplying section 41 to make the static electricity supplying section 41 supply static electricity to the lower electrode 12 as shown by a broken line at the first row (a) in FIG. 6. As a result, the semiconductor wafer 18 is in close contact with the lower electrode 12 by static electricity. As shown in a fourth row labelled (d) in FIG. 6, the main control section 22 controls the pressure control section 19 so that the pressure control section 22 supplies the coolant gas to the sealed chamber 11 through the gas path 12b which is formed in the lower electrode 12.

When the semiconductor wafer 18 is in close contact with the lower electrode 12 and the coolant gas is supplied to the sealed chamber 11 as described above, the semiconductor wafer 18 is effectively chilled by the lower electrode 12 so that the temperature of the semiconductor wafer 18 drops as shown by the third row (c) in FIG. 6.

After the pressure of the coolant gas becomes stable as shown in the fourth row (d) in FIG. 6, the etching gas is introduced into the sealed chamber 11 through the inlet port 11a. In this case, chlorine is introduced into the sealed chamber 11 with a flow rate of 10 sccm. Oxygen is introduced into the sealed chamber 11 with a flow rate of 2 sccm. The pressure of the sealed chamber 11 is kept at a pressure of 5 mTorr.

After that, the main control section 22 controls the high-frequency matching section 14 so that the high-frequency matching section 14 supplies the lower electrode 12 with the high-frequency power of 150 watts as shown by a solid line at the first row (a) in FIG. 6 in order to produce the etching plasma in the sealed chamber 11. The polysilicon layer of the semiconductor wafer 18 is etched into a patterned polysilicon layer by the etching plasma.

The monochromator 20 produces the second monitored signal on etching the polysilicon layer to supply the second monitored signal to the detecting section 21 as shown at the second row (b) in FIG. 6. When the second monitored level drops and reaches to the second predetermined level, the detecting section 21 detects that the etching of the polysilicon layer ends. When the detecting section 21 detects that the etching of the polysilicon layer ends, the detecting section 21 supplies the second end signal to the main control section 22.

Responsive to the second end signal, the main control section 22 controls the static electricity supplying section 41 so that the static electricity supplying section 41 stops supplying static electricity to the lower electrode 12 immediately before the predetermined time duration lapses as shown by the broken line at the first row (a) in FIG. 6. As a result, the semiconductor wafer 18 is not in close contact with the lower electrode 12. The main control section 22 controls the high-frequency matching section 14 so that the high-frequency matching section 14 stops supplying the high-frequency power to the lower electrode 12 as shown by the solid line at the first row (a) in FIG. 6 after the predetermined time duration lapses. After that, the etching gas is exhausted from the sealed chamber 11 through the outlet port 11b. Namely, the polysilicon layer is etched until the predetermined time duration lapses after the second end signal is supplied to the main control section 22. Furthermore, the main control section 22 controls the pressure control section 19 so that the pressure control section 19 stops supplying the coolant gas to the sealed chamber 11 as shown at the fourth row (d) in FIG. 6.

Inasmuch as the polysilicon layer is etched into the patterned polysilicon layer under a low temperature as described above, it is possible to obtain the processed semiconductor wafer having a good etched form.

As described above, the temperature control section 15 controls the temperature of the lower electrode 12 to the predetermined temperature. In the above-mentioned embodiment, the predetermined temperature is controlled to 0° C. by the temperature control section 15 in order that the temperature of the semiconductor wafer 18 is controlled to about 100° C. during of etching the WSi layer and the temperature of the semiconductor wafer 18 is controlled to about 20° C. on etching the polysilicon layer.

As readily understood from the above-mentioned embodiment, it is possible to obtain the processed semiconductor wafer having the good etched form when the silicide layer is etched at a high temperature and the polysilicon layer is etched at a lower temperature. According to a test, it is possible to obtain the processed semiconductor wafer having the good etched form when the predetermined temperature is a temperature between −30° C. and 0° C., inclusive.

What is claimed is:

1. An etching method for etching a semiconductor substrate comprising a polysilicon layer and a silicide layer by plasma etching to produce a processed semiconductor substrate having a patterned silicide layer and a patterned polysilicon layer, said etching method comprising the steps of:

locating said semiconductor substrate on a supporting member;

controlling a temperature of said supporting member to substantially equal a first temperature;

etching said silicide layer into said patterned silicide layer by plasma etching;

cooling said supporting member to substantially equal a second temperature; and etching said polysilicon layer into said patterned polysilicon layer by plasma etching to produce said processed semiconductor substrate.

2. An etching method as claimed in claim 1, wherein said cooling step comprises the steps of:

clamping said semiconductor substrate in close contact with said supporting member; and supplying said supporting member with a coolant gas.

3. An etching method as claimed in claim 2, wherein said coolant gas is an inert gas.

4. An etching method as claimed in claim 3, wherein said inert is helium gas.

5. An etching method as claimed in claim 1, wherein said first temperature is a value substantially in the range 0° C. and −30° C., inclusive.

6. An etching method as claimed in claim 1, wherein said cooling step comprises the steps of:

placing said semiconductor substrate in close contact with said supporting member; and supplying said supporting member with a coolant gas.

7. An etching method as claimed in claim 5, wherein said substrate has a temperature substantially equal to a value in a range of 90° C. to 110° C. during said silicide etching step.

8. An etching method as claimed in claim 5, wherein said substrate has a temperature substantially equal to a value in a range of 10° C. to 30° C. during said polysilicon etching step.

* * * * *